(12) United States Patent
Fornaca et al.

(10) Patent No.: US 6,479,830 B1
(45) Date of Patent: Nov. 12, 2002

(54) LOW-SPUTTER-YIELD COATING FOR HARDWARE NEAR LASER-PRODUCED PLASMA

(75) Inventors: Steven W. Fornaca, Torrance, CA (US); Samuel Talmadge, Agoura Hills, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/704,414

(22) Filed: Nov. 1, 2000

(51) Int. Cl.[7] ............................ H01J 37/08; G03C 5/00; H05H 6/00
(52) U.S. Cl. .................... 250/492.21; 250/492.2; 250/492.22; 430/311; 430/322; 378/119
(58) Field of Search ............... 250/492.1, 492.22, 250/492.21; 378/119; 359/150; 148/33; 437/225; 430/311, 322

(56) References Cited

U.S. PATENT DOCUMENTS

| | | | | |
|---|---|---|---|---|
| 5,374,318 A | * | 12/1994 | Rabalais et al. | 148/33 |
| 6,011,267 A | * | 1/2000 | Kubiak et al. | 250/423 P |
| 6,190,835 B1 | * | 2/2001 | Haas et al. | 430/311 |
| 6,285,737 B1 | * | 9/2001 | Sweatt et al. | 378/85 |

* cited by examiner

*Primary Examiner*—Jack Berman
*Assistant Examiner*—Kalimah Fernandez

(57) ABSTRACT

The invention relates to an extreme ultraviolet lithography system that utilizes thin film protective coatings to protect a plurality of hardware components, located near a laser-produced light source, from the erosive effects of energetic particles emitted by the laser-produced light source.

9 Claims, 2 Drawing Sheets

LOW-SPUTTER-YIELD COATING FOR HARDWARE NEAR LASER-PRODUCED PLASMA

BACKGROUND OF THE INVENTION

1. Field of the Invention

The present invention relates generally to an extreme ultraviolet lithography system and, more specifically, to an extreme ultraviolet lithography system that utilizes protective diamond thin film coatings to reduce the erosive effects on hardware components as a result of energetic particles emitted from a laser-produced plasma light source.

2. Description of the Prior Art

In extreme ultraviolet lithography (EUVL), a next-generation microchip fabrication process, a laser-produced plasma (LPP) light source or "fireball" generates extremely short wavelength radiation (the shorter the wavelength, the smaller, denser and faster the transistors on the microchip) that is the result of high density clusters of material introduced by a nozzle interacting with high-intensity long-wavelength radiation from a pulsed laser.

Referring to FIG. 1, a material 10, such as xenon, is introduced through a nozzle 12. As it leaves the nozzle 12, the material 10 is in the form of extremely small high-density clusters that absorb the high-intensity long-wavelength radiation 14 from a pulsed laser (not shown). A highly Ionized energetic plasma forms and emits copious amounts of short wavelength radiation to form the LPP light source 16. Essentially, the plasma converts long-wavelength laser power into short wavelength extreme ultraviolet (EUV) power. As a practical matter, a nearby "diffuser" may be used to collect and re-circulate the unused material 10 so that the gas load on the EUVL system's vacuum pumps is reduced. Not shown, is nearby hardware for supporting both the nozzle 12 and the diffuser 18. This hardware is very compact. For example, the gap between the nozzle 12 and the diffuser 18 Is typically less than a centimeter and the distance from the nozzle to the plasma fireball is typically 1.5 to 5 millimeters.

Referring to FIG. 2, the laser-produced plasma (LPP) light source or "fireball" 16 generates extremely short wavelength radiation which is the result of the jet of material 10 from nozzle 12 interacting with high-intensity long-wavelength radiation from the pulsed laser, as previously described. Next, a condenser optics assembly 20 projects the radiation 22 onto a mask 24 that collects the radiation 22. As with standard lithography techniques, a projection optics assembly 26 collects the light reflected from the mask 24 and images features of the mask 24 onto a water 28, exposing a photoresist. The mask 24 and the wafer 28 are moved together so the entire pattern on the mask 24 is replicated on the wafer 28.

Because the fireball 16 emits many kilowatts of power, with roughly half of the absorbed power going into radiation and the other half into kinetic energy of plasma ions and electrons, a sizable fraction of each half is eventually intercepted by source hardware components contained within the EUVL chamber, causing the hardware components to structurally erode and/or their functional capabilities to degrade. Structural erosion occurs as a result of a hardware component losing material through the sputtering by the plasma ions or neutral atoms. And a functional degradation occurs as a result of the sputtered material collecting on the surface of a hardware component. For example, because of its close proximity to the plasma light source, a first mirror (not shown) of the condenser optics assembly 20 typically becomes contaminated and loses its reflectivity, necessitating its frequent replacement. These frequent replacements can have an unacceptable impact on the maintenance and cost of ownership of an EUVL system.

By covering the relevant hardware with a low-sputter yield material such as graphite, conventional EUVL systems have reduced hardware material losses that are the consequence of ion sputtering, but mirror contamination issues still remain. Additionally, because the thermal contact between conventional protective covers and the surfaces of the hardware components is poor, the temperature of the cover tends to rise. And since sputter yield is the number of particles released from or near the hardware surface, per Incident particle, the attendant rise in temperature of the protective cover increases the sputter yield as the surface of the hardware approaches melting or sublimation temperatures. Thermal management and erosion problems are closely related since most materials that have low sputter yield do not have acceptable thermal properties. For example, conventional nozzles (see FIG. 1, numeral 12) are typically made from solid graphite, which has very low sputter yield but poor thermal conductivity, or copper, which has excellent thermal conductivity but a high sputter yield.

Therefore, based on the shortcomings of the prior art, an extreme ultraviolet lithography system that reduces the erosive effects of ion sputtering under thermally managed conditions by utilizing thin film, low-sputter yield protective coatings on high-thermal conductive hardware component materials is highly desirable.

SUMMARY OF THE INVENTION

The present invention provides an extreme ultraviolet lithography system including a laser-produced plasma light source for generating short wavelength radiation and a plurality of hardware components located near the laser-produced plasma light source. Each hardware component is formed of a high-thermal conductive material and a layer of thin film material is deposited over the outer surface of the hardware element. The thin film layer protects the hardware component from the erosive effects of a plasma of the short wavelength radiation without decreasing the thermal contact between the layer and the outer surface of the hardware component.

BRIEF DESCRIPTION OF THE DRAWINGS

Reference is now made to the following description and attached drawings, wherein.

DETAILED DESCRIPTION OF THE INVENTION

Figure 1:
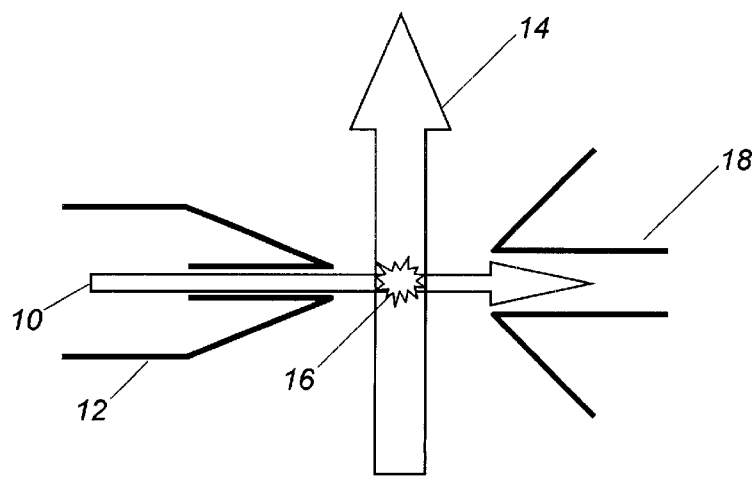
FIG. 1 is a schematic illustration of a laser produced plasma (LPP) light source formed by the interaction of small clusters of high-density material introduced through a nozzle with high-intensity long-wavelength radiation from a pulsed laser.
Figure 2:
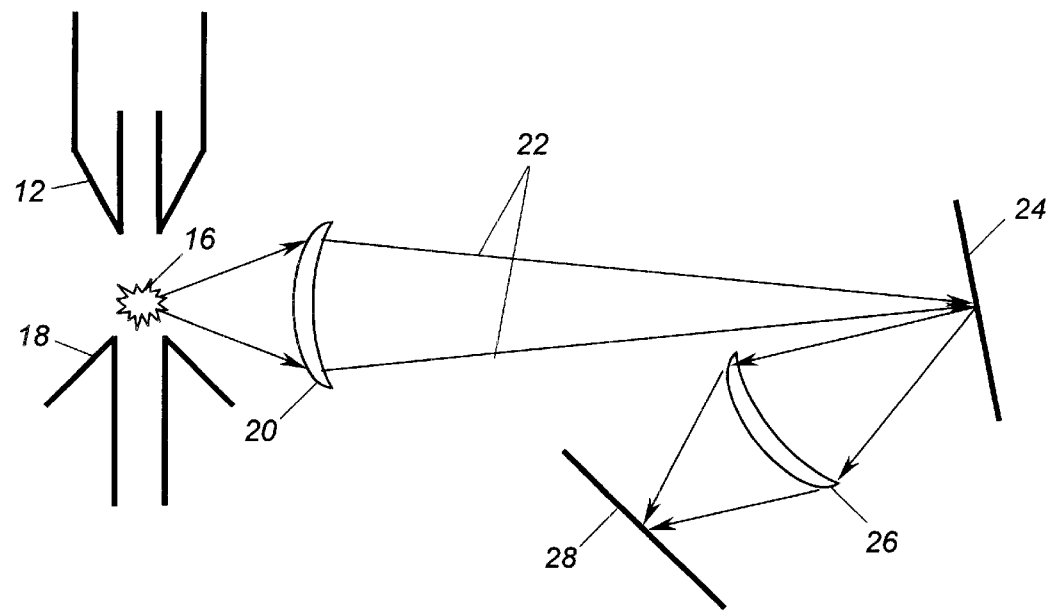
FIG. 2 is a schematic illustration of a conventional extreme ultraviolet lithography (EUVL) system.
Figure 3:
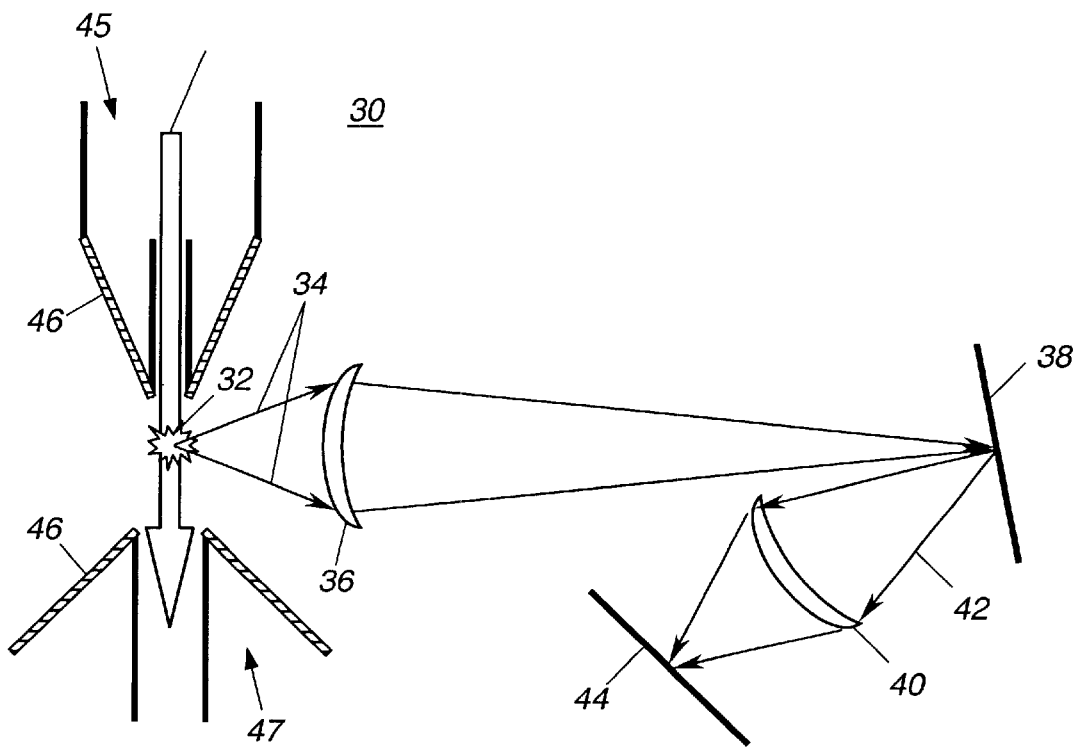
FIG. 3 is a schematic illustration of an extreme ultraviolet lithography (EUVL) system in accordance with a preferred embodiment of the present invention.
Figure 4A:
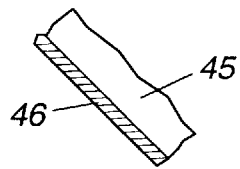
FIG. 4a Is an enlarged cross-sectional view of a portion of a hardware component shown in FIG. 3.
Figure 4B:
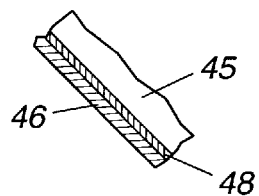
FIG. 4b is a view similar to FIG. 4a but including a transition layer on the hardware component.

Referring to FIG. 3, an extreme ultraviolet lithography system 30 is illustrated In which thin film (e.g., 0.1 to 1 micrometer) protective coatings of low-sputter-yield material are deposited on a plurality of hardware components formed of high-thermal conductive materials, as described in more detail below. As with conventional EUV lithography systems, the system 30 includes a laser-produced plasma (LPP) light source or fireball 32. The fireball 32 generates extremely short wavelength radiation 34 that is formed by the interaction between droplets of material 43 introduced through a nozzle 45 and high-intensity long wavelength radiation from a pulsed laser (not shown). A nearby diffuser 47 may also be included to collect and re-circulate the unused material 43. It is important to note that the present invention is not limited to a particular type of material 43. Rather, the present Invention may be used for any laser-produced plasma material that may be used in extreme ultraviolet lithography.

As In conventional EUV lithography systems, the radiation 34 is collected by a condenser optics assembly 36 that projects the radiation 34 onto a mask 38. A projection optics assembly 40 collects the light 42 reflected from the mask 38 and Images features of the mask 38 onto a wafer 44, exposing a photoresist. For purposes of illustration, the optics (36, 40) are represented schematically in FIG. 3 by lenses. However, in practice they are each complex systems of several curved mirrors with state-of-the-an reflective coatings.

Hardware components near the fireball 32, including, but not limited to, the nozzle 45, the condenser hardware (not shown), and the support hardware (not shown) are preferably fabricated from high-thermal conductive materials and their surfaces are coated with a thin film material 46, preferably diamond thin film. The preferred hardware component material is copper (Cu), chosen for its high thermal conductivity.

One method of producing the thin diamond film coatings is to use a sputtering process known in the art as plasma-assisted chemical vapor deposition (PACVD). However, it is important to note that other deposition means, including, but not limited to chemical vapor deposition (CVD), may alternatively be used. PACVD uses a radio frequency discharge in a mixture of methane and hydrogen gases to form a low-density, low-energy plasma. The radio frequency discharge disassociates the methane and the graphite and diamond forms of carbon grown on the hardware component substrate. Diamond films made by this method tend to grow more slowly, but are of a higher quality than those produced by other methods. The machines that produce these coatings may be commercially available from Applied Science and Technology, Woburn, Mass.

The hardware component to be coated is immersed in the low density, low energy plasma, which conforms to the surface of the hardware component, resulting in a more uniform coating. Preferably, the hardware component is also electrically biased which causes the plasma ions to be driven further into the surface of the hardware component. This type of biasing may be accomplished by any one of several commercial diamond film machines also available from Applied Science and Technology.

The sputtering process described above accomplishes two primary purposes. First, it initially cleans the surface of the hardware component by breaking down oxide layers. And, second, as the graphite and the diamond are deposited on the surface of the hardware component, the graphite preferentially sputters away because it has a higher sputter yield than the diamond. As a result, the diamond film grows slowly as its formation is partially balanced by erosion, leaving only diamond behind. However, to ensure that the thin film layer 46 is formed of diamond rather than graphite, it may be necessary to raise the temperature of the hardware component to over 800° C. during the film growth process. This elevation of temperatures during the film growth process is based on a thermodynamic argument in the art concerning the relative stability of graphite and diamond, namely, that at low temperature and pressure, graphite is a stable form of crystalline carbon. However, because the plasma temperature is tens of thousands of degrees, the argument may not hold, and conducting the film growth process at room temperatures may be adequate.

Alternatively, a thin mixed transition layer 48 may be formed between the outer surface of the copper hardware component, e.g., 45 and the thin film diamond layer 46 to ensure optimal adhesion of the diamond layer 46 to the copper surface of the hardware component. For example, the surface of the hardware component 45 may be coated with a layer 48 of nickel (Ni), known In the art for its superior adhesion characteristics.

The diamond films 46, once coated on the relevant hardware components (45, 47) of the extreme ultraviolet lithography system 30, become the surfaces that the energetic ion and/or neutral atoms radiating from the fireball 32 strike, thus reducing erosion as a result of material loss. Moreover, because diamond has a significantly low sputter yield, substantially less contamination will be produced on the mirrored components 36 of the system 30. These reductions in contamination will essentially double the useful lifetime of the mirrors 36, thus, reducing the operating costs of an EUV lithography system by hundreds-of-thousands to millions of dollars per year.

Additionally, the high thermal conductivity of diamond and the thinness of the film allow the diamond film 46 to essentially be at the same temperature as the hardware it coats. This is important since the lower the physical temperature of the exposed diamond film's surface, the more its sputter yield is reduced. This type of thermal management also provides optimal scalability for high-average power laser-plasma sources needed for EUV lithography systems in which the plasma fireball typically radiates several kilowatts of power.

Obviously, many modifications and variations of the present invention are possible in light of the above teachings. Thus, it is to be understood that, within the scope of the appended claims, the invention may be practiced otherwise than as specifically described above.

What is claimed is:

1. An extreme ultraviolet lithography system comprising:
a laser-produced plasma light source for generating short wavelength radiation;
a plurality of optical components positioned to receive and utilize the radiation; and
a plurality of non-optical hardware components, each located proximal to the laser-produced plasma light source, each hardware component formed of a high-thermal conductive material and each having a layer of thin film material deposited over an outer surface, wherein the layer of thin film material protects the hardware component from the erosive effects of a plasma of the short wavelength radiation, resulting in reduced sputtering contamination of the optical components, without decreasing the thermal contact between the thin film layer and the outer surface of the hardware component;
and wherein the layer of thin film material is a thin film diamond material.

2. An extreme ultraviolet lithography system as recited in claim 1, further comprising a transition layer disposed between the layer of thin film material and the outer surface of each hardware component.

3. An extreme ultraviolet lithography system as recited in claim 2, wherein the transition layer is a nickel (Ni) material.

4. An extreme ultraviolet lithography system as recited in claim 1, wherein the laser-produced plasma light source is formed by the interaction between a laser beam and a jet of gaseous material.

5. An extreme ultraviolet lithography system as recited in claim 4, wherein the jet of gaseous material is produced by a nozzle located proximal to the laser-produced plasma light source.

6. An extreme ultraviolet lithography system as recited in claim 5, wherein the nozzle is one of the plurality of hardware components.

7. An extreme ultraviolet lithography system as recited in claim 4, wherein the gaseous material is a xenon gas material.

8. An extreme ultraviolet lithography system as recited in claim 1, wherein the high-thermal conductive material is a copper (Cu) material.

9. An extreme ultraviolet lithography system as recited in claim 1, wherein the layer of thin film diamond material is a low-sputter yield material.

* * * * *